(12) United States Patent
Westphal et al.

(10) Patent No.: US 6,507,259 B2
(45) Date of Patent: Jan. 14, 2003

(54) ACTIVELY SHIELDED SUPERCONDUCTING MAGNET WITH PROTECTION MEANS

(75) Inventors: Michael Westphal, Offembach (DE); Gerald Neuberth, Bruchsal (DE)

(73) Assignee: Bruker BioSpin GmbH (DE)

( * ) Notice: Subject to any disclaimer, the term of this patent is extended or adjusted under 35 U.S.C. 154(b) by 1 day.

(21) Appl. No.: 09/901,496

(22) Filed: Jul. 9, 2001

(65) Prior Publication Data

US 2002/0014938 A1 Feb. 7, 2002

(30) Foreign Application Priority Data

Jul. 8, 2000 (DE) ......................................... 100 33 411

(51) Int. Cl.⁷ ............................................... H01F 7/22
(52) U.S. Cl. ..................... 335/301; 335/216; 335/299; 324/319; 324/320
(58) Field of Search ...................... 335/216, 296–301; 324/318–320

(56) References Cited

U.S. PATENT DOCUMENTS

| | | | |
|---|---|---|---|
| 4,658,229 A | * | 4/1987 | Chen et al. .................. 335/216 |
| 5,329,266 A | * | 7/1994 | Soeldner et al. ............ 324/319 |
| 5,668,515 A | | 9/1997 | Ariyoshi |
| 5,739,997 A | | 4/1998 | Gross |

FOREIGN PATENT DOCUMENTS

| | | |
|---|---|---|
| EP | 0 489 291 A2 | 6/1992 |
| GB | 2 298 282 A | 8/1996 |
| JP | 6-347575 A | 6/1993 |

OTHER PUBLICATIONS

F.J. Davies, R.T. Elliott, D.G. Hawksworth, IEEE Trans. Magn. 27/2, 1677–1680, Mar. 1991.

M.N. Wilson, Superconducting Magnets, Clarendon Press Oxford, 1983, Chap. 9, No Month.

* cited by examiner

*Primary Examiner*—Ramon M. Barrera
(74) *Attorney, Agent, or Firm*—Walter A. Hackler

(57) ABSTRACT

A magnet coil arrangement comprising an actively shielded superconducting primary circuit (21) comprising first and second magnet windings (1,2,3 and 4,5), and being wound e.g. in winding chambers (7,8,9 and 10,11) in a supporting body (6a,6b) for generating a strong magnetic field in a working volume with a small magnetic stray field and a short circuited secondary circuit (22) which is inductively coupled with the primary circuit (21) and contains third and fourth magnet windings (13,14,15 and 16,17) is characterized in that the magnet windings (13,14,15 and 16,17) of the secondary circuit (22) form an actively shielded magnet coil. This permits a simple and robust coil protection for actively shielded superconducting magnets during a quench wherein the superconducting magnet windings are reliably relieved and the magnetic stray field of the entire arrangement remains small.

20 Claims, 2 Drawing Sheets

PRIOR ART

ACTIVELY SHIELDED SUPERCONDUCTING MAGNET WITH PROTECTION MEANS

BACKGROUND OF THE INVENTION

The invention concerns a magnet coil arrangement with an actively shielded superconducting primary circuit, consisting of first and second magnet windings and being wound e.g. in winding chambers in a supporting body, for generating a strong magnetic field in a working volume with a small magnetic stray field and a short-circuited secondary circuit which is coupled to the primary circuit and contains third and fourth magnet windings.

Actively shielded magnet coil systems comprise in general first and second magnet windings, which are symmetrical with respect to rotation, of superconducting wire for generating a strong magnetic field in a working volume or for reducing the strength of the magnetic stray field and a means for protecting the magnet windings from overheating, high electrical voltages and uncontrolled mechanical forces in case of a quench (transition of the magnet winding from the superconducting state into the normally conducting state).

Magnet coils of this type are known from the document F. J. Davies, R. T. Elliott, D. G. Hawksworth, IEEE Trans. Magn. 27/2, 1677–1680, 1991.

Magnet systems of this type are used e.g. for generating strong magnetic fields e.g. in magnetic resonance apparatus or Fourier transform mass spectrometers.

The first magnet windings which produce fields comprise a smaller diameter than the second magnet windings which minimize the stray field. The current direction in the second magnet windings is opposite to the current direction of the first magnet windings. The magnet windings are e.g. disposed on a coil body in winding chambers and contain a plurality of windings each.

The number N2 of windings of the second magnet windings are smaller than the number N1 of windings of the first magnet windings. The ratio between winding numbers N2/N1 is selected approximately such that the magnetic dipole moment of the first and second magnet windings are in total considerably smaller than the magnetic dipole moment of the first magnet windings.

The windings are electrically connected in series and usually form a closed electric circuit of superconducting wire. During normal operation, the electric current through all windings is identical.

The superconducting wire has a negligible small electric resistance during normal operation and can transport high electric currents practically without any electric loss. The electric current density in the superconducting wire has a magnitude of several 100 A/mm$^2$ and is therefore a multiple of that which would be possible with normally conducting wires, e.g. of copper.

Superconducting wires are superconducting only at very low temperatures below a critical temperature. This critical temperature is approximately 8 K for the alloy NbTi which is often used for conventional superconducting wires. The magnet coils are therefore operated in a bath with liquid helium at a boiling temperature of 4.2 K.

The magnet windings are exposed to considerable inner forces during normal operation of a superconducting magnet, caused by Lorentz forces. Tensile stresses may occur in a region far above 100 MPa in the superconducting wires.

A further physical feature of superconducting magnet coils consists in that, at their typical operating temperature of 4.2 K , the heat capacity of all materials, i.e. also of the superconducting material, becomes negligible compared to the values at room temperature. This can cause that very small local mechanical relaxations within a magnet winding which can occur easily with the large mechanical tensions, lead to considerable local temperature increases on the order of several K. The magnet winding can therefore assume locally a temperature above the critical temperature and becomes normally conducting.

Upon normal conduction, the operating current of the magnet coil does not flow without losses any more at this location, but produces considerable heat whereupon this normally conducting region assumes yet higher temperatures and expands. This process, called "quench", usually causes complete discharge of the superconducting magnet thereby converting the complete energy stored in the magnetic field in the normally conducting regions of the magnet windings into heat.

This energy is often in the range of several MJ. As a rule, the stored magnetic energy can correspond approximately to the mechanical potential energy independent of the magnitude of the magnet coil which one obtains by lifting the magnet coil by several 100 m against gravity.

If the normally conducting regions of the magnet windings remain limited to a small volume portion of the magnet windings during a quench, the entire magnetic energy is converted into heat only in this small volume portion wherein these regions can overheat thereby destroying the magnet coil.

A further problem consists in that during a quench within the magnet windings, larger electric voltages occur which can cause electric breakdown thereby also destroying the magnet coil.

Electric protective circuits are known for avoiding overheating and excessive electrical voltages. A plurality of such protective circuits is described in the document M. N. Wilson, Superconducting Magnets, Clarendon Press Oxford, 1983, Chap. 9. In a method described therein, the magnet windings are subdivided into partial windings and ohmic protective resistors are connected in parallel to all partial windings.

During normal operation, no current flows through the ohmic resistors when the superconducting magnet is charged. In case of a quench in a partial winding, the current in this partial winding is reduced and flows via the ohmic resistance which is connected in parallel. Inductive coupling increases at first simultaneously the current in the other still superconducting partial windings.

This type of coil protection has two main advantages: on the one hand, the "first" partial winding from which the quench starts experiences less thermal load through rapid reduction of the current and on the other hand, the quench caused by an increase of the current in other partial windings can cause a transition from the superconducting to the normally conducting state can be distributed to all partial windings. The rather uniform distribution of the entire magnet coil thereby avoids inadmissible local temperature increases.

The reduction of the current in the first partial winding and the current increases in the other partial windings are larger and more rapid, the smaller the resistance values of the protective resistors compared to the ohmic resistances of the regions of the partial windings which have become normally conducting. Often diodes are used instead of protective resistors which act like low-ohmic resistances with electric voltages above some volts.

A disadvantage of such protective resistors with resistances and diodes consists in that completely different currents flow through the partial windings during a quench. Such a protective circuit is therefore little suitable for an actively shielded superconducting magnet since the good stray field shielding is achieved only when identical currents flow through all partial windings. This condition is not met during a quench.

A magnet with protection of this kind produces a considerable magnetic stray field during a quench which can cause considerable damages to things and persons, such as e.g. deletion of information on magnetic data carriers close to the magnet or damages through magnetic objects which are catapulted towards the magnet. A further disadvantage consists in that in this type of coil protection, the current in the still superconducting partial windings exceeds partially the operating current thereby possibly mechanically stressing these partial windings too much.

The protective resistor described in the document F. J. Davies, R. T. Elliott, D. G. Hawksworth, IEEE Trans. Magn. 27/2, 1677–1680, 1991 is supposed to prevent these disadvantages during a quench. In this protective resistor, an ohmic resistance is also formally connected in parallel to a partial winding. It has a high ohmic value compared to the resistances of the superconducting wire occurring in normally conducting regions of the magnet windings during a quench and carries only small currents compared to the operating current of the magnet. The currents in the partial windings of the magnet during a quench are therefore approximately identical and the magnet does not lose its shielding effect.

The ohmic resistance is a network of resistances connected in parallel and in series which are disposed at different locations of the magnet windings and act as a heater in the case of a quench and which are supposed to effect rapid propagation of the normally conducting region onto the entire magnet coil. The disadvantage thereby consists in that the current in the magnet winding is rapidly reduced only when the heaters have ignited the quench in the different regions of the magnet windings. The optimum design of the resistance network requires also rapid heating and triggering of the quench at different locations of the magnet winding but on the other hand requires little thermal load during the complete quench, such that it is not damaged, a lot of experience and care and the risk of damage to the magnet coil system is large if the resistance network is not optimally designed.

An alternative type of coil protection during a quench which is also described in the document M. N. Wilson, Superconducting Magnets, Clarendon Press Oxford, 1983, Chap. 9 consists of a resistive short-circuited secondary winding which is inductively coupled to the magnet winding. During a quench, the current in the superconducting magnet winding is relatively quickly reduced while the current in the originally current-less secondary winding increases correspondingly due to inductive coupling thereby leading to heating up of the secondary winding. If the secondary winding is in good thermal contact to different regions of the superconducting magnet windings, a quench is also triggered there and the normally-conducting region is propagated to the entire magnet coil.

A coil body of electrically well conducting material represents such an inductively coupled secondary winding and can act as coil protection. An advantage with this type of coil protection consists in that the current is decoupled relatively quickly from the superconducting magnet winding due to the inductive coupling with the secondary winding right at the beginning of the quench and completely other regions, namely the resistive secondary winding are heated instead and furthermore the normally conducting region is propagated quickly to all regions of the magnet windings. For actively shielded magnets, the magnetic stray field increases considerably during the quench since the current-carrying secondary winding, e.g. in the form of a conductive coil body, can produce strong stray fields in this phase.

In contrast thereto, it is the object of the present invention to produce a simple and robust coil protection for actively shielded superconducting magnets during a quench, wherein the superconducting magnet windings are reliably relieved and the magnetic stray field of the entire arrangement remains small.

SUMMARY OF THE INVENTION

This object is achieved in a simple and effective manner in that not only the entire magnet coil arrangement but also the magnet windings of the secondary circuit alone form an actively shielded magnet coil with the effect that no magnetic stray field is produced irrespective of the strength of the current which flows through the secondary circuit during a quench. This arrangement permits during a quench, that the current is quickly decoupled from the superconducting primary circuit through inductive coupling thereby relieving same thermally and mechanically, that the current couples into the secondary circuit thereby stressing only the latter in a thermal and mechanical fashion.

In an advantageous embodiment, part of the magnet windings of the secondary circuit comprise windings of a resistive and not superconducting wire. In this fashion, thermal energy is produced during a quench in the resistive windings of the magnet windings of the secondary circuit. This thermal energy can be utilized for triggering the quench in different regions of the magnet windings of the primary circuit.

In an advantageous further development, the magnet windings of the secondary circuit are completely made from resistive not superconducting wire which makes the material for the magnet windings of the secondary circuit particularly inexpensive and also produces heat in all regions of the magnet windings during a quench which can be utilized for the propagation of a quench in the magnet windings of the primary circuit.

In an advantageous further development, the magnet windings of the secondary circuit consist of copper wire which is easily available. Due to the high electric conductivity of copper at the low temperatures which are required for producing the superconducting state of the magnet windings of the primary circuit, the electric resistance of the secondary circuit can be kept relatively low which has an advantageous effect on the speed with which the electric current is decoupled from the primary circuit.

In a further advantageous embodiment, the magnet windings of the secondary circuit and of the superconducting primary circuit have good thermally conductive contact thereby deriving the heat produced in the magnet windings of the secondary circuit during a quench in the region of the thermally conducting contact into the neighboring regions of the magnet windings of the primary circuit and triggers a quench also there such that larger regions of the magnet windings of the primary circuit become quicker normally conducting and the energy stored in the magnetic field before a quench is converted into heat more uniformly in all volume regions of the magnet windings of the primary circuit and the secondary circuit.

In an advantageous embodiment of the invention, the magnet windings of the primary circuit and of the secondary circuit are disposed in the same winding chambers of the supporting body. A particularly simple and inexpensive supporting body can be used therefor.

In an advantageous embodiment of the invention, the magnet windings of the secondary circuit are wound in the winding chambers directly or separated only by a dielectric insulation layer onto the finished magnet windings of the primary circuit. This is a particularly simple embodiment for the good heat-conducting contact between the magnet windings of the primary circuit and of the secondary circuit in the winding chambers. The magnet windings of the secondary circuit act as mechanical compression for the superconducting magnet windings of the primary circuit which are subjected to large tensile stress due to magnetic Lorentz forces during normal operation thereby producing mechanical relieve.

In an advantageous embodiment, the secondary circuit has a cold diode with high current-carrying capacity which is switched in the passing direction relative to the current which flows in the secondary circuit during a quench. Such a cold diode blocks also in the passing direction up to voltages of a few Volts at the existing low temperatures of 4.2 K. This offers the advantage that with such relatively small electric voltages which are required for charging and are common for such magnets there is no electric current in the secondary circuit which could heat the magnet windings of the secondary circuit and thereby indirectly the magnet windings of the primary circuit thereby triggering a quench in the magnet windings of the primary circuit. In case of the higher electric voltages which occur during a quench, the diode is conducting thereby ensuring the protective effect of the arrangement.

In a further advantageous embodiment of the invention, the secondary circuit finally contains ohmic resistances. These resistances heat up during a quench and can be used to transfer superconducting regions of the magnet windings of the primary circuit or further superconducting construction elements such as e.g. superconducting switches into the normally conducting state. The superconducting switches can be components of circuits which contain superconducting auxiliary coils such as e.g. shim coils which serve for homogenizing the magnetic field.

Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and further explained with reference to embodiments.

DESCRIPTION OF THE PREFERRED EMBODIMENT

Figure 3:
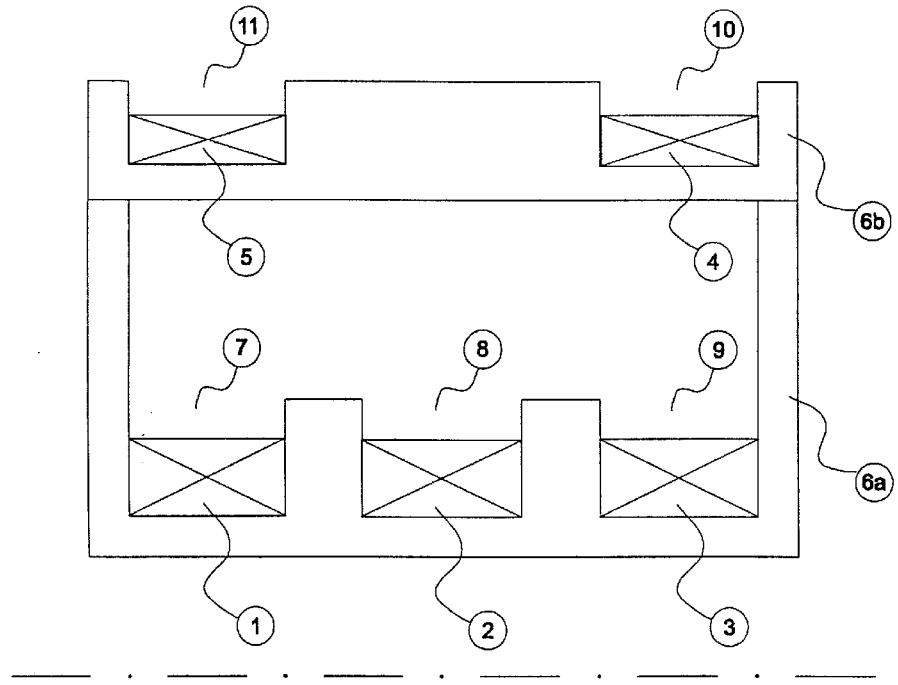
FIG. 3 shows a section through a magnet coil arrangement according to prior art.

The section of FIG. 3 shows essential components of a conventional rotationally symmetric magnet coil arrangement. Winding chambers 7,8,9,10,11 are included in a two-component supporting body 6,1,6b. First magnet windings 1,2,3 and second magnet windings 4,5 are wound, each of superconducting wire, in these winding chambers. The first magnet windings 1,2,3 serve mainly for producing a strong magnetic field in a working volume which surrounds e.g. with magnet coil arrangements for magnet resonance apparatus the symmetrical center of the magnet coil arrangement. The second magnet windings 4,5, mainly minimize the magnetic stray field in the outer surroundings of the magnet coil arrangement. The direction of the electric current in the second magnet winding is therefore opposite to the direction of the electric current in the first magnet windings. To obtain optimum shielding, the second, radially outer windings have fewer windings than the first radially inner windings.

Figure 4:
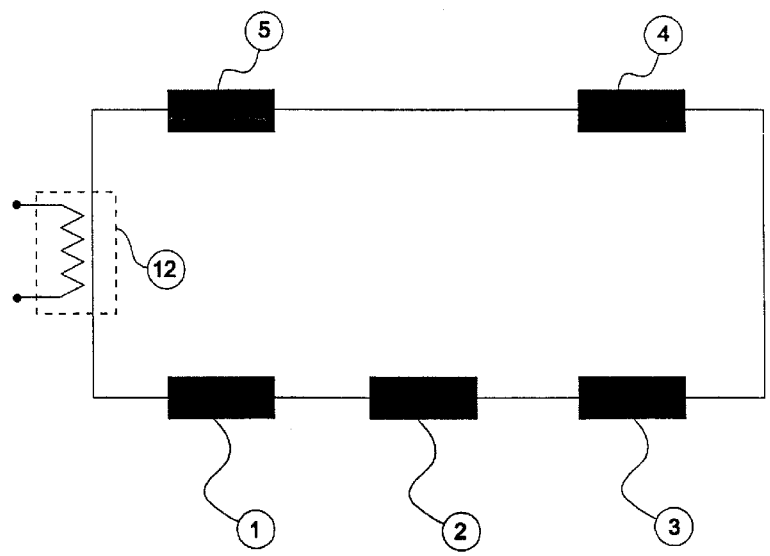
FIG. 4 shows the electric wiring diagram of the magnet coil arrangement according to FIG. 3

FIG. 4 shows the electric series connection of the magnet windings 1,2,3,4,5 disposed in the different winding chambers during normal operation of the magnet coil arrangement of FIG. 3. They form together with the superconducting switch 12 of the magnet coil arrangement a current-carrying closed superconducting circle during normal operation of the arrangement. Ohmic resistors which might be required for coil protection and are e.g. connected in parallel to the magnet windings, are not shown. Such protective resistors would not guarantee that identical currents flow in the second and first magnet windings during a quench. For this reason it wold no longer be guaranteed that the magnetic stray field of the magnet coil arrangement remains small during a quench.

Figure 1:
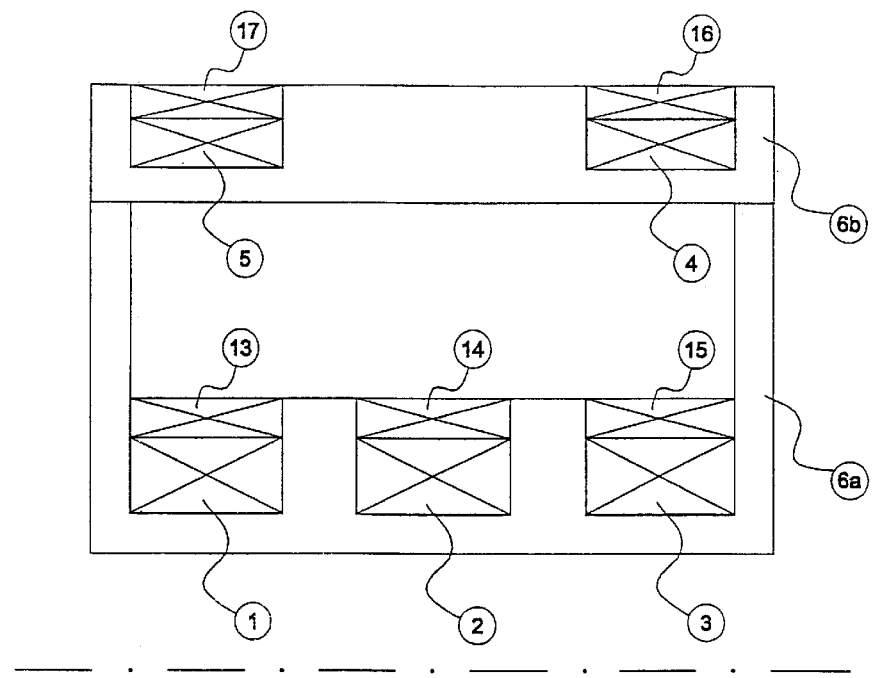
FIG. 1 shows a section through an inventive magnet coil arrangement.

The section of FIG. 1 shows the essential components of a rotationally symmetric magnet coil arrangement in accordance with the invention which is shown in this example with the conventional magnet coil arrangement of FIG. 3 in that third magnet windings 13,14,15 of normally conducting copper wire are wound to the outside of the first magnet winings 1,2,3 and fourth magnet windings 16,17 of normally conducting copper wire are wound to the second magnet windings 4,5 of superconducting wire. The windings 1,2,3, 4,5 of superconducting wire form the primary winding. The windings 13,14,15,16,17 of copper wire form the secondary winding.

The winding numbers in the third (13,14,15) and fourth (16,17) magnet windings are designed in a magnet coil arrangement in accordance with the invention such that with an assumed electric current in the secondary circuit alone a magnetic field is generated in the working volume, but that the magnetic stray field in the outer surroundings of the secondary circuit is at a minimum. The direction of the electric current in the fourth magnet windings 16,17 is opposite to the direction of the electric current in the third magnet windings 13,14,15. For this reason, the winding number of the radially outer fourth magnet windings 16,17 is smaller than the winding number of the radially inner third magnet windings 13,14,15.

In the case of a quench in part of the magnet windings of the primary circuit, the current in the primary circuit is quickly reduced. Inductive coupling of the resistive secondary coil with the primary coil induces a current in the secondary coil with the same speed. The current induced in the secondary circuit produces a contribution to the magnetic field of the arrangement of a direction such that the reduction of the magnetic field, e.g. in the working volume of the magnet arrangement, is reduced with rapid decrease of the current.

Neither the current in the primary circuit nor the current in the secondary circuit produce a strong stray field in the external surroundings of the magnet arrangement in accordance with the invention. For this reason, the entire stray field produced through both windings remains small in the external surroundings of the magnet arrangement irrespective of the rapidly changing current strength in the magnet windings of the primary and secondary circuit individually.

Since the windings 13,14,15,16,17 of the secondary circuit are wound to the superconducting windings 1,2,3,4,5 of the primary circuit, they act as mechanical compression with completely superconducting magnet windings in the primary circuit which otherwise reduces the large mechanical tensile stresses in the magnet windings of the primary circuit due to Lorentz forces. Furthermore, there is a good thermal contact between the magnet windings of the primary and secondary circuit such that the resistive parts of the magnet windings of the secondary circuit which heat up during a quench trigger transition from the superconducting into the normally conducting state at all contacting surfaces in the magnet windings of the primary circuit.

Figure 2:
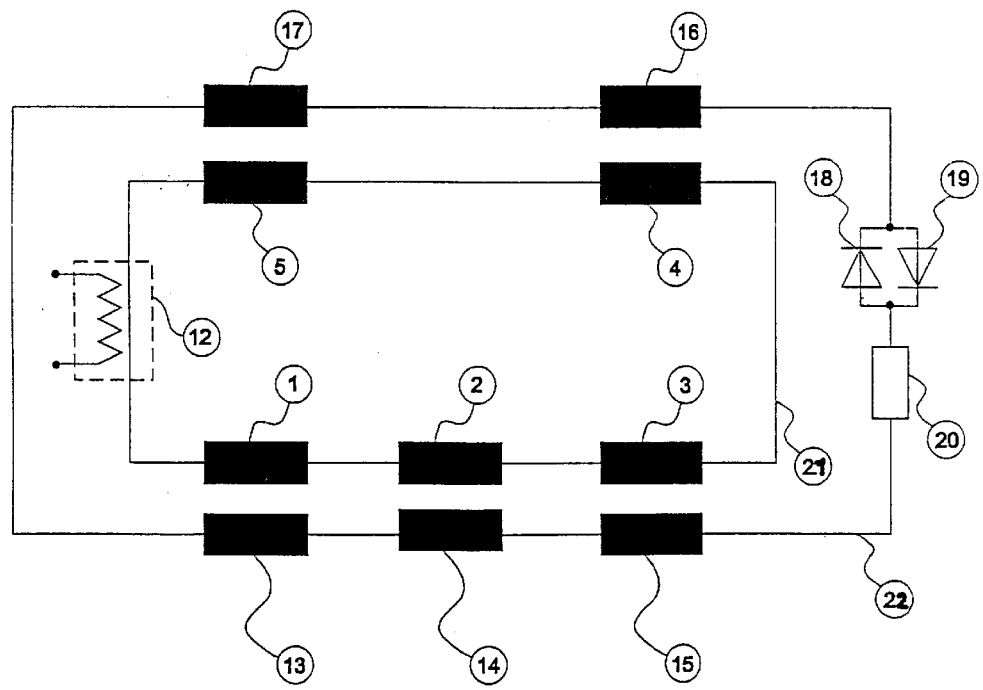
FIG. 2 shows the electric wiring diagram of an inventive magnet coil arrangement.

FIG. 2 finally shows the electric circuit of the magnet windings shown in FIG. 1. The first magnet windings 1,2,3 and the second magnet windings 4,5 form together with the superconducting switch 12 of the magnet coil arrangement a current-carrying closed superconducting circuit during normal operation of the arrangement. The third magnet windings 13,14,15 and the fourth magnet windings 16,17 form together with diodes 18,19, which are not absolutely necessary, and the resistor 20 a non-superconducting secondary circuit 22 which is inductively coupled with the primary circuit 21.

The cold diodes 18,19 which are connected anti-parallel in this case, block completely at the operating temperature of the magnet coil arrangement of 4.2 K to electric voltages in the region of a few volts and prevent flow of an electric current in the secondary circuit during charging of the superconducting magnet which consists of superconducting windings 1,2,3,4,5 if the electric voltages for charging the magnet are small enough. During a quench an inductively generated electric current flows through one of the two diodes and through the magnet windings 13,14,15,16,17 of the secondary circuit. The resistor 20 is also heated thereby which is in thermal contact with part of the magnet windings of the primary circuit or with superconducting switches e.g. of superconducting auxiliary coils (not shown) and can trigger a transition into the normally conducting state.

We claim:

1. Magnet coil arrangement comprising an actively shielded superconducting primary circuit (21) comprising first and second magnet windings (1,2,3 and 4,5) and being wound e.g. in winding chambers (7,8,9 and 10,11) in a supporting body (6a,6b) for generating a strong magnetic field in a working volume with a small magnetic stray field and a short-circuited secondary circuit (22) which is inductively coupled to the primary circuit (21) and contains third and fourth magnet windings (13,14,15 and 16,17), characterized in that the magnet windings (13,14,15 and 16,17) of the secondary circuit (22) per se form an actively shielded magnet coil.

2. Magnet coil arrangement according to claim 1, characterized in that part of the magnet windings (13,14,15 and 16,17) of the secondary circuit (22) contains windings of resistive non-superconducting wire.

3. Magnet coil arrangement according to claim 2, characterized in that the magnet windings (13,14,15 and 16,17) of the secondary circuit (22) consist completely of resistive non-superconducting wire.

4. Magnet coil arrangement according to claim 3, characterized in that the magnet windings (13,14,15 and 16,17) of the secondary circuit (22) consist completely of copper wire.

5. Magnet coil arrangement according to claim 2, characterized in that the secondary circuit (22) contains at least one ohmic resistance (20).

6. Magnet coil arrangement according to claim 1, characterized in that the magnet windings (13,14,15 and 16,17) of the secondary circuit (22) and the magnet windings (1,2,3 and 4,5) of the superconducting primary circuit (21) are in a good thermally-conducting contact with each other.

7. Magnet coil arrangement according to claim 1, characterized in that the magnet windings (1,2,3 and 4,5) of the primary circuit (21) and the magnet windings (13,14,15 and 16,17) of the secondary circuit (22) are disposed in the same winding chambers (7,8,9 and 10,11) of the supporting body (6a,6b).

8. Magnet coil arrangement according to claim 1, characterized in that the magnet windings (13,14,15 and 16,17) of the secondary circuit (22) are wound directly or separated only by a dielectric insulation layer onto the finished magnet windings (1,2,3 and 4,5) of the primary circuit (21) in the winding chambers (7,8,9 and 10,11).

9. Magnet coil arrangement according to claim 1, characterized in that the secondary circuit (22) contains at least one cold diode (18,19) with high current-carrying capacity which is switched in the passage direction with respect to the current flowing in the secondary circuit (22) during a quench.

10. Magnet coil arrangement according to claim 1, characterized in that part of the magnet windings (13,14,15 and 16,17) of the secondary circuit (22) contains windings of resistive non-superconducting wire, and the magnet windings (13,14,15 and 16,17) of the secondary circuit (22) and the magnet windings (1,2,3 and 4,5) of the superconducting primary circuit (21) are in a good thermally-conducting contact with each other.

11. Magnet coil arrangement according to claim 1, characterized in that part of the magnet windings (13,14,15 and 16,17) of the secondary circuit (22) contains windings of resistive non-superconducting wire, and the magnet windings (1,2,3 and 4,5) of the primary circuit (21) and the magnet windings (13,14,15 and 16,17) of the secondary circuit (22) are disposed in the same winding chambers (7,8,9 and 10,11) of the supporting body (6a,6b).

12. Magnet coil arrangement according to claim 1, characterized in that part of the magnet windings (13,14,15 and 16,17) of the secondary circuit (22) contains windings of resistive non-superconducting wire, and the magnet windings (13,14,15 and 16,17) of the secondary circuit (22) are wound directly or separated only by a dielectric insulation layer onto the finished magnet windings (1,2,3 and 4,5) of the primary circuit (21) in the winding chambers (7,8,9 and 10,11).

13. Magnet coil arrangement according to claim 1, characterized in that part of the magnet windings (13,14,15 and 16,17) of the secondary circuit (22) contains windings of resistive non-superconducting wire, and the secondary circuit (22) contains at least one cold diode (18,19) with high current-carrying capacity which is switched in the passage direction with respect to the current flowing in the secondary circuit (22) during a quench.

14. Magnet coil arrangement according to claim 1, characterized in that the magnet windings (1,2,3 and 4,5) of the primary circuit (21) and the magnet windings (13,14,15 and 16,17) of the secondary circuit (22) are disposed in the same winding chambers (7,8,9 and 10,11) of the supporting body (6a,6b), and the magnet windings (13,14,15 and 16,17) of the secondary circuit (22) are wound directly or separated only by a dielectric insulation layer onto the finished magnet windings (1,2,3 and 4,5) of the primary circuit (21) in the winding chambers (7,8,9 and 10,11).

15. Magnet coil arrangement according to claim 1, characterized in that the magnet windings (1,2,3 and 4,5) of the primary circuit (21) and the magnet windings (13,14,15 and 16,17) of the secondary circuit (22) are disposed in the same winding chambers (7,8,9 and 10,11) of the supporting body (6a,6b), and the secondary circuit (22) contains at least one cold diode (18,19) with high current-carrying capacity which is switched in the passage direction with respect to the current flowing in the secondary circuit (22) during a quench.

16. Magnet coil arrangement according to claim 1, characterized in that the magnet windings (1,2,3 and 4,5) of the primary circuit (21) and the magnet windings (13,14,15 and 16,17) of the secondary circuit (22) are disposed in the same winding chambers (7,8,9 and 10,11) of the supporting body (6a,6b), and that the secondary circuit (22) contains at least one ohmic resistance (20).

17. Magnet coil arrangement according to claim 1, characterized in that the magnet windings (13,14,15 and 16,17) of the secondary circuit (22) are wound directly or separated only by a dielectric insulation layer onto the finished magnet windings (1,2,3 and 4,5) of the primary circuit (21) in the winding chambers (7,8,9 and 10,11), and the secondary circuit (22) contains at least one cold diode (18,19) with high current-carrying capacity which is switched in the passage direction with respect to the current flowing in the secondary circuit (22) during a quench.

18. Magnet coil arrangement according to claim 17, characterized in that that the magnet windings (1,2,3 and 4,5) of the primary circuit (21) and the magnet windings (13,14,15 and 16,17) of the secondary circuit (22) are disposed in the same winding chambers (7,8,9 and 10,11) of the supporting body (6a,6b), and that the secondary circuit (22) contains at least one ohmic resistance (20).

19. Magnet coil arrangement according to claim 1, characterized in that the magnet windings (13,14,15 and 16,17) of the secondary circuit (22) are wound directly or separated only by a dielectric insulation layer onto the finished magnet windings (1,2,3 and 4,5) of the primary circuit (21) in the winding chambers (7,8,9 and 10,11), and that the secondary circuit (22) contains at least one ohmic resistance (20).

20. Magnet coil arrangement according to claim 1, characterized in that the secondary circuit (22) contains at least one cold diode (18,19) with high current-carrying capacity which is switched in the passage direction with respect to the current flowing in the secondary circuit (22) during a quench, and that the secondary circuit (22) contains at least one ohmic resistance (20).

* * * * *